(12) United States Patent
Hwang

(10) Patent No.: US 6,383,953 B2
(45) Date of Patent: May 7, 2002

(54) APPARATUS FOR FABRICATING SEMICONDUCTOR DEVICE AND METHOD FOR FABRICATING SEMICONDUCTOR USING THE SAME

(75) Inventor: Chul Ju Hwang, Seongnam (KR)

(73) Assignee: Jusung Engineering Co., Ltd. (KR)

( * ) Notice: Subject to any disclaimer, the term of this patent is extended or adjusted under 35 U.S.C. 154(b) by 0 days.

(21) Appl. No.: 09/804,902

(22) Filed: Mar. 13, 2001

(30) Foreign Application Priority Data

Mar. 14, 2000 (KR) ........................................ 2000-12754

(51) Int. Cl.$^7$ ............................................. H01L 21/31
(52) U.S. Cl. .................... 438/788; 427/393.4; 427/450; 427/38; 427/39; 427/248; 313/309; 313/310
(58) Field of Search ........................ 438/788; 427/393.4, 427/450, 38–39, 248; 313/309, 310; 505/1

(56) References Cited

U.S. PATENT DOCUMENTS

| | | | |
|---|---|---|---|
| 5,157,015 A | * 10/1992 | Snyder et al. .................. | 505/1 |
| 5,345,079 A | * 9/1994 | French et al. ................ | 250/288 |
| 5,368,897 A | * 11/1994 | Kurihara et al. ............. | 427/450 |
| 5,403,399 A | * 4/1995 | Kurihara et al. ............. | 118/723 |
| 5,648,699 A | * 7/1997 | Jin et al. ...................... | 313/309 |
| 5,709,577 A | * 1/1998 | Jin et al. ....................... | 445/24 |
| 5,955,377 A | * 9/1999 | Maul et al. ................... | 436/518 |
| 5,977,697 A | * 11/1999 | Jin et al. ...................... | 313/310 |
| 6,156,389 A | * 12/2000 | Brown et al. ............. | 427/393.4 |
| 6,329,899 B1 | * 12/2001 | Hunt et al. .................. | 338/308 |

* cited by examiner

Primary Examiner—John F. Niebling
Assistant Examiner—Olivia T Luk
(74) Attorney, Agent, or Firm—Ostrolenk, Faber, Gerb & Soffen

(57) ABSTRACT

An apparatus for fabricating a semiconductor device includes: a plasma torch having a hollow convey tube of which one end portion is made of a conductor so as to serve as an inner electrode, for injecting plasma generating gas through one end portion, conveying and spraying a plasma frame through the other end portion; an energy applying unit for applying a microwave to the gas conveyed through the convey tube and adds an energy thereto; an outer electrode for surrounding the other end portion of the convey tube and its extended portion coaxially; an insulation tube positioned between the convey tube and the outer electrode for electrically insulating the other end portion of the convey tube and the outer electrode and surrounding partially the convey tube coaxially; a power source for applying a voltage to the inner electrode and the outer electrode; a susceptor installed facing the plasma frame sprayed from the plasma torch; a susceptor moving unit for moving the susceptor in the vertical and horizontal directions to the other end portion of the convey tube; and a reactive chamber for surrounding the other end portion of the convey tube and the susceptor and defining a reactive space. Since the RTA or the RTCVD, the processes of fabricating a semiconductor device, are performed by using the plasma spray apparatus guaranteeing a high stability and having various process variables, various fabrication processes of the semiconductor can be implemented.

9 Claims, 3 Drawing Sheets

APPARATUS FOR FABRICATING SEMICONDUCTOR DEVICE AND METHOD FOR FABRICATING SEMICONDUCTOR USING THE SAME

BACKGROUND OF THE INVENTION

1. Field of the Invention

The present invention relates to a method for fabricating a semiconductor device, and more particularly, to a plasma spray apparatus and a method for fabricating a semiconductor device using the plasma spray apparatus.

2. Description of the Background Art

A plasma spray coating refers to a technique that a metal or a ceramic material is melted by a high temperature plasma which is generated by an intense current passing through gas, which is sprayed on a substrate to form a strong coating film on the substrate. This technique is well known in the field of architecture and mechanic painting field as well as the semiconductor device fabrication field.

FIG. 1 illustrates a generally adopted plasma spray coating apparatus in accordance with a conventional art.

With reference to FIG. 1, a cathode bar in the shape of pintle of a hinge is fixed by an insulator 2, and a hollow tube shape anode tube 3 surrounds the cathode bar 1. The anode tube 3 is also fixed by the insulator 2 at one end portion thereof.

The anode tube includes a tube 3a having a larger diameter and a tube 3b having a relatively smaller diameter which are connected to each other, and the cathode bar 1 is positioned in the larger-diameter tube 3a.

The acute tip portion 1a of the cathode bar 1 is positioned near the end of one side of the smaller-diameter tube 3b. The smaller-diameter tube 3b serves as an anode for generating plasma and as a passageway for discharging the generated plasma, that is, a nozzle 3b.

A gas injection port 4 of gas for formation of plasma is formed at the anode tube 3 in the vicinity of the tip of the other side of the cathode bar 1, through which plasma forming gas (inert gas such as Helium or Argon) is injected.

The other tip 1b of the cathode bar 1 is connected to a cathode terminal of a power source 7 by a conductor 6, and an anode terminal of the power source 7 is connected with the anode nozzle 3b through an excitation power source 9 by a conductor 8.

When the DC voltage coming from a power source 7 is applied between the anode and the cathode, to which a high frequency voltage is overlapped by the high frequency excitation power source 9, and thus, plasma gas (mostly, inert gas such as Ar is used for plasma gas) flows into the anode nozzle 3b in the direction of arrow (10), an electric arc 11 is generated between the front end 1a of the cathode bar 1 and the inner wall face of the anode nozzle 3b.

In this case, the short electric arc 11 have an impact on the wall face of the anode nozzle 3b. Accordingly, a large amount of plasma gas 5 is supplied so that the generated electric arc goes out as far as possible in the anode nozzle 3b to form an anode point 12 far distanced from the cathode bar 1.

The plasma gas 5 flowing into the anode nozzle 3b is heated at a high temperature by the arc 11, broken to be changed to a plasma state and sprayed from the front end portion of the anode nozzle 3b. At this time, a spray coating material 15 is supplied thereto from a coating material injection pipe 14.

As indicated by an arrow 16 of FIG. 1, the coating material is mixed with the high temperature plasma 13 to instantly form a melting material. The melting material collides with the substrate 22 and a coating film 21 is formed on the surface of the substrate 22.

According to circumstances, the spray coating material 15 coming out of the coating material injection pipe 14 may be injected at the very front portion 17 of the opening of the anode nozzle 2 or may be injected at the very back portion 18 as indicated by arrow.

The above described plasma spray apparatus has been employed to form the coating film on the exterior of a stuff.

The present invention, however, adopts such plasma spray coating apparatus to fabrication of a semiconductor device.

In this respect, however, the following problems arise to adopt the conventional plasma spray apparatus as it is to fabrication of a semiconductor device.

First, if a thin film (a coating layer) is formed on the surface of a large scale semiconductor substrate by using a single plasma nozzle channel, the thickness of the thin film formed on the area close to the opening of the anode nozzle and the thickness of the thin film formed on the area distant from the opening of the anode nozzle become different. That is, it is difficult to form a uniform thickness of thin film on the large area.

Secondly, since the coating material itself coming out of the coating material injection pipe is not activated, an electric arc should be intense, to which, thus, a high DC voltage should be supplied from a power source. Therefore, a unit cost of process is increased.

Thirdly, as the semiconductor device is more highly integrated and have more functions, a necessity is growing that the substrate is heated for a very short time with a high temperature-rising rate.

In order to rise the temperature of the semiconductor device, there have proposed a method in which a plurality of halogen lamps are put close to the semiconductor device and a method in which a heater is installed at the lower portion of a suscepter supporting the semiconductor device.

These methods, however, are disadvantageous. First, as for the method for heating the substrate rapidly, due to the attribute of the Halogen lamp, it is not possible to increase the temperature-rising rate with a RTP (rapid Thermal Process) which rapidly heats the substrate by putting a plurality of Halogen lamps close to the semiconductor substrate. Also, the temperature-rising rate is hardly controlled freely. Meanwhile, In case of installation of the heater for the suscepter, since the suscepter, the medium, exists between the semiconductor substrate and the heater, it is not easy to increase the semiconductor substrate rapidly.

SUMMARY OF THE INVENTION

Therefore, an object of the present invention is to provide an apparatus for fabricating a semiconductor device that is capable of forming a thin film of an even thickness on a large substrate by using a plasma spray function.

Another object of the present invention is to provide an apparatus for fabricating a semiconductor device that is capable of rising the temperature of a semiconductor device rapidly at a even temperature by using a plasma spray function.

Still another object of the present invention is to provide a chemical vapor deposition method and a rapid thermal processing method for a method for fabricating a semiconductor device using the plasma spray apparatus.

To achieve these and other advantages in accordance with the purpose of the present invention, as embodied and broadly described herein, there is provided to an apparatus for fabricating a semiconductor device including: a plasma torch having a hollow convey tube of which one end portion is made of a conductor so as to serve as an inner electrode, for injecting plasma generating gas through one end portion, conveying and spraying a plasma frame through the other end portion; an energy applying unit for applying a microwave to the gas conveyed through the convey tube and adds an energy thereto; an outer electrode for surrounding the other end portion of the convey tube and its extended portion coaxially; an insulation tube positioned between the convey tube and the outer electrode for electrically insulating the other end portion of the convey tube and the outer electrode and surrounding partially the convey tube coaxially; a power source for applying a voltage to the inner electrode and the outer electrode; a susceptor installed facing the plasma frame sprayed from the plasma torch; a susceptor moving unit for moving the susceptor in the vertical and horizontal directions to the other end portion of the convey tube; and a reactive chamber for surrounding the other end portion of the convey tube and the susceptor and defining a reactive space.

In the apparatus for fabricating a semiconductor device of the present invention, the insulator tube is preferably a quartz tube.

In the apparatus for fabricating a semiconductor device of the present invention, the energy applying unit includes a waveguide resonator surrounding partially the convey tube in a closed type, and a magnetron for applying microwave into the waveguide resonator to excite the plasma generating gas conveyed through the convey tube.

The apparatus for fabricating a semiconductor device of the present invention further includes a reactive gas supply unit for supplying a reactive gas into the reactive chamber to form a thin film on the surface of the semiconductor substrate disposed on the upper surface of the susceptor by a chemical vapor deposition. In this case, the reactive gas supply unit is preferably installed to be positioned in the vicinity of the other end portions of the convey tube.

The apparatus for fabricating a semiconductor device of the present invention further includes a heating unit inside the susceptor.

In the apparatus for fabricating a semiconductor device of the present invention, a main convey tube may be commonly connected with one end portions of the convey tubes so that the plasma generating gas can be conveyed through the main convey tube into the convey tubes.

In the apparatus for fabricating a semiconductor device of the present invention, the energy applying unit may be installed in the main convey tube.

A semiconductor device fabricating process such as a rapid thermal process for heating rapidly a semiconductor device or a chemical vapor deposition process accompanying the rapid thermal process can be perform by using the apparatus for fabricating a semiconductor of the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
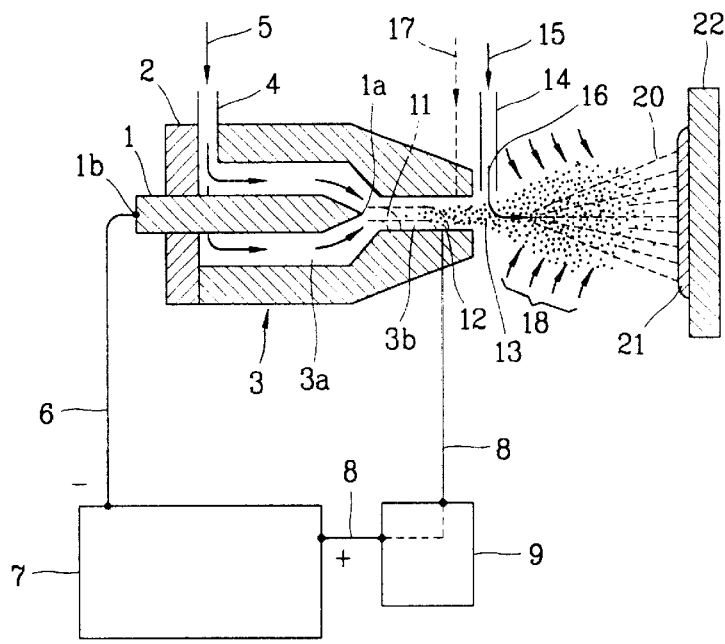
FIG. 1 is a schematic view of a plasma coating apparatus adopted in a conventional art.
Figure 2:
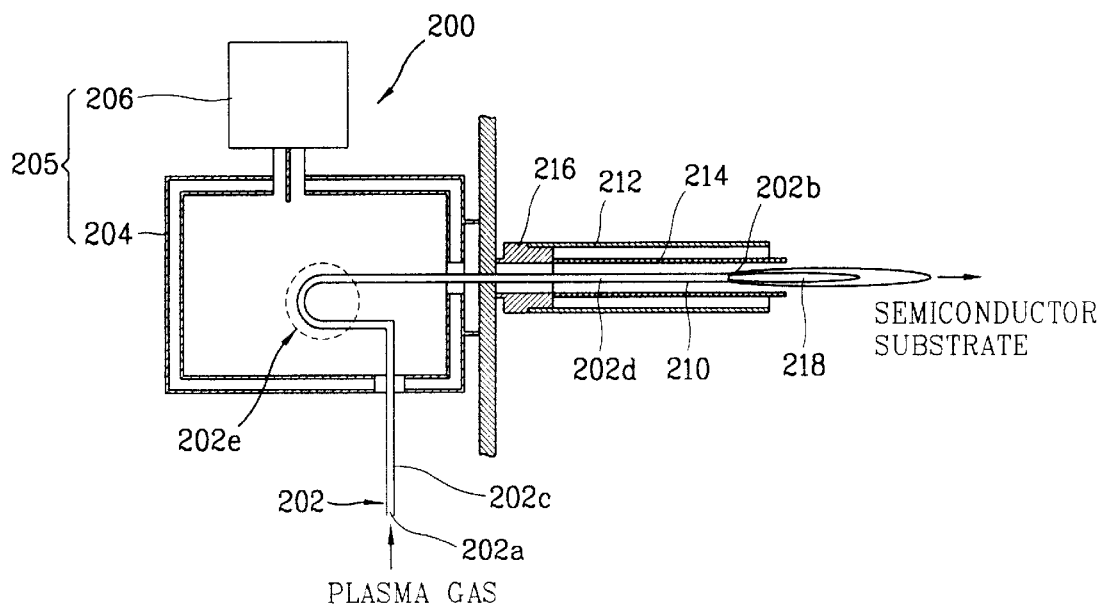
FIG. 2 is a sectional view of a plasma torch in use for a plasma spray apparatus in accordance with the present invention.

FIG. 2 is a sectional view of a plasma torch in use for a plasma spray apparatus in accordance with the present invention.

As shown in the drawing, there is provided a plasma gas convey tube 202 and an inert gas for forming plasma such as Ar or He is supplied through one end portion 202a thereof and plasma is sprayed from the other end portion 202b. The convey tube 202 is partially closed by a waveguide resonator 204.

The convey tube 202 is bent in a gun shape. That is, the convey tube 202 includes the first portion 202c, the second portion 202d and the connecting portion 202e connecting the first portion 202c and the second portion 202d. The first portion 202c and the second portion 202d are almost at a right angle.

A part of the first portion 202c, the connecting portion 202e and a part of the second portion 202d of the convey tube 202 are surrounded by the waveguide resonator 204. The connecting portion 202e, the part of the convey tube surrounded by the resonator 204 is formed in a loop shape so as to transfer the maximum energy to the plasma generating gas by magnetic resonance.

A magnetron 206 is installed at the upper portion of the resonator 204. 2.45 GHz microwave is applied into the resonator 204 by the magnetron 206, so that the plasma generating gas conveying through the convey tube 202 is excited and proceeds toward the other end portion 202b of the convey tube. The combination of resonator 204 and the magnetron 206 are called an energy applying unit 205.

The other end portion 202b of the convey tube 202 is a hollow conductor tube having a diameter of 2 mm so that it is functioned as an inner electrode in forming the plasma frame 218.

A quartz tube 214 having a diameter of 6 mm surrounds the second portion 202d and the other end portion 202b extended outwardly of the resonator 204 coaxially, and an outer electrode 212 having a diameter of 10 mm is formed outside surrounding the other end portion 202b and the quartz tube 214 coaxially.

The outer electrode 212 and the other end portion 202b of the convey tube, that is, the inner electrode, are isolated electrically and physically by the insulator 216.

A power source (not shown) is connected between the other end portion 202b of the convey tube serving as the inner electrode and the outer electrode 212 so as to apply a DC high voltage.

As for the plasma torch 200 having such a structure, since the resonator 204 and the magnetron 206 apply energy in advance to the plasma forming gas, even though a lower DC voltage than in the conventional art is applied to the inner electrode and the outer electrode, the plasma frame 218 is easily generated.

Figure 3:
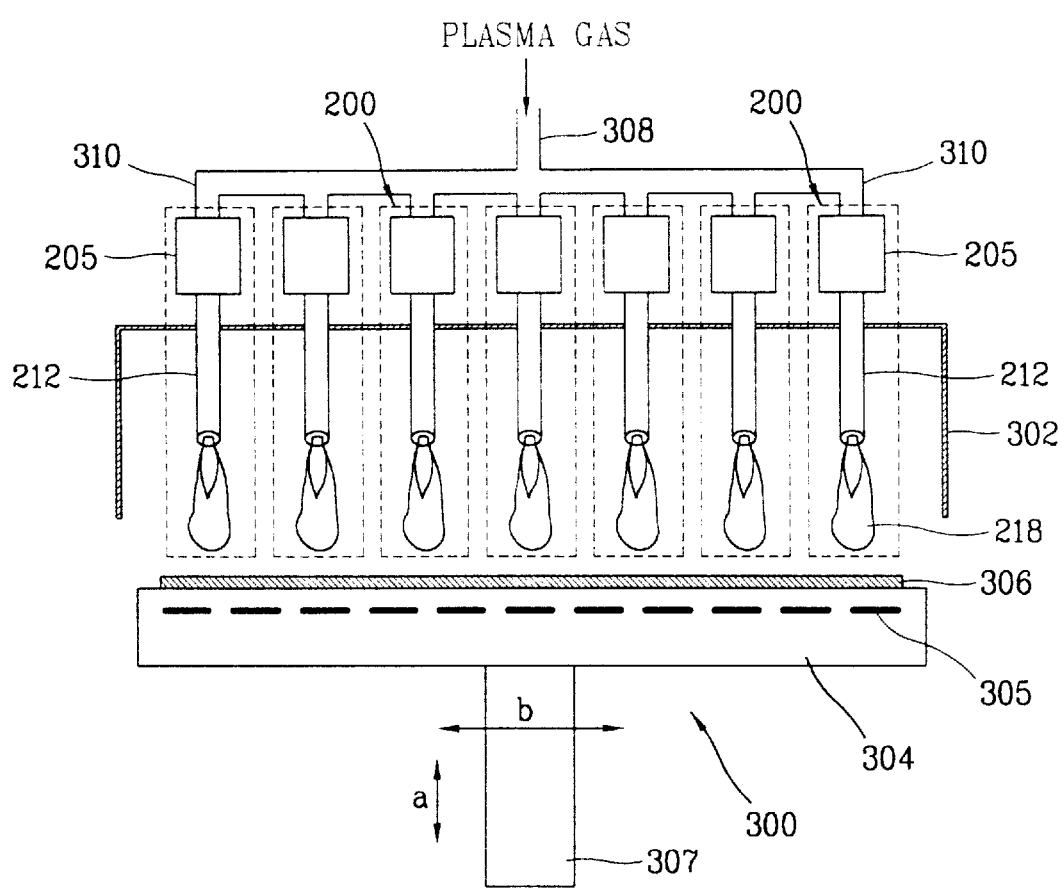
FIG. 3 is a sectional view of a plasma spray apparatus in accordance with one embodiment of the present invention.

FIG. 3 is a schematic sectional view of a plasma spray apparatus 300 adopting the plasma torch of FIG. 2 in accordance with one embodiment of the present invention.

The same reference numerals are given to the same elements as FIG. 2, descriptions of which are omitted.

As shown in the drawing, a plasma forming gas is injected to a main convey tube 308. A plurality of branch tubes 301 are diverged from the main convey tube 308. Each branch tube 310 is connected with the plasma torch 200 as illustrated in FIG. 2.

The energy applying unit 205 consisting of wave-guide resonator and the magnetron is installed at a part of the convey tube 202 of the plasma torch 200. At this time, the power consumed in the magnetron of the energy applying unit 205 is controlled generally in the range of 600~900 W.

The other end portion (202b of FIG. 2) of the gas convey tube functioning as the inner electrode and the quartz tube penetrate the chamber wall 302 of the plasma spray apparatus as they are being surrounded by the outer electrodes 212. That is, the chamber 302 wholly surrounds the outer electrodes 212 and the plasma frames 218 of each plasma torch 200.

A suscepter 304, on which the semiconductor substrate 306 is to be mounted, is installed at the lower portion of the plasma torch 200 in the chamber 302, and a heater 305 is installed inside the suscepter 304.

The suscepter 304 is supported by a support 307 which includes a vertical direction moving unit (not shown) for moving the suscepter 304 vertically (a) from or to the plasma torch 200 and a horizontal direction moving unit (not shown) for moving the suscepter 304 in the horizontal direction (b).

A method for fabricating a semiconductor device using the plasma spray apparatus 300 of FIG. 3 will now be described.

The plasma spray apparatus 300 is to perform an RTA (rapid thermal annealing), to which inert gas for forming plasma including $N_2$ or Ar is supplied through the main convey tube 308.

The plasma forming gas introduced through the main convey tube 308 is split to flow into the convey tubes 202 of the plurality of plasma torch 200.

Next, a high DC voltage is applied to the inner electrode (reference numeral 210 of FIG. 2) and to the outer electrode 212 by a power source (not shown) of the plasma torch 200, a high temperature plasma frame 218 is generated in each plasma torch 200.

As for the plurality of plasma torches 200, its inner and outer electrodes are distributed to be disposed so that the plasma frame 218 generated from the plasma torch 200 entirely covers the substrate 306 mounted on the suscepter 304. In this respect, the inner electrode and the outer electrode have the same length so that the same strength of plasma frame 218 is applied to the substrate 306.

Meanwhile, a suscepter moving unit (not shown) is provided to the support 307 supporting the suscepter 306, so as to move the substrate 306 in the vertical direction (a) or in the horizontal direction (b) for the plasma frame 218 to perform the RTA at the uniform temperature.

During the process, the base pressure inside of the chamber is controlled to be $10^{-7}$ Torr by a vacuum pump (not shown). The temperature of the substrate 306 is controlled by using the heater 305 inserted in the suscepter 306 or by controlling the voltage applied to the power source of the plasma torch.

In FIG. 3, the energy applying unit 205 is installed at every branch tube 310. But, according to circumstances, the energy applying unit 205 may be installed by one at the main convey tube 308.

As described above, adoption of the plasma spray apparatus of FIG. 3 to the rapid thermal process of the fabrication of the semiconductor device has the advantage that the semiconductor substrate can be heated rapidly and with uniform temperature.

Figure 4:
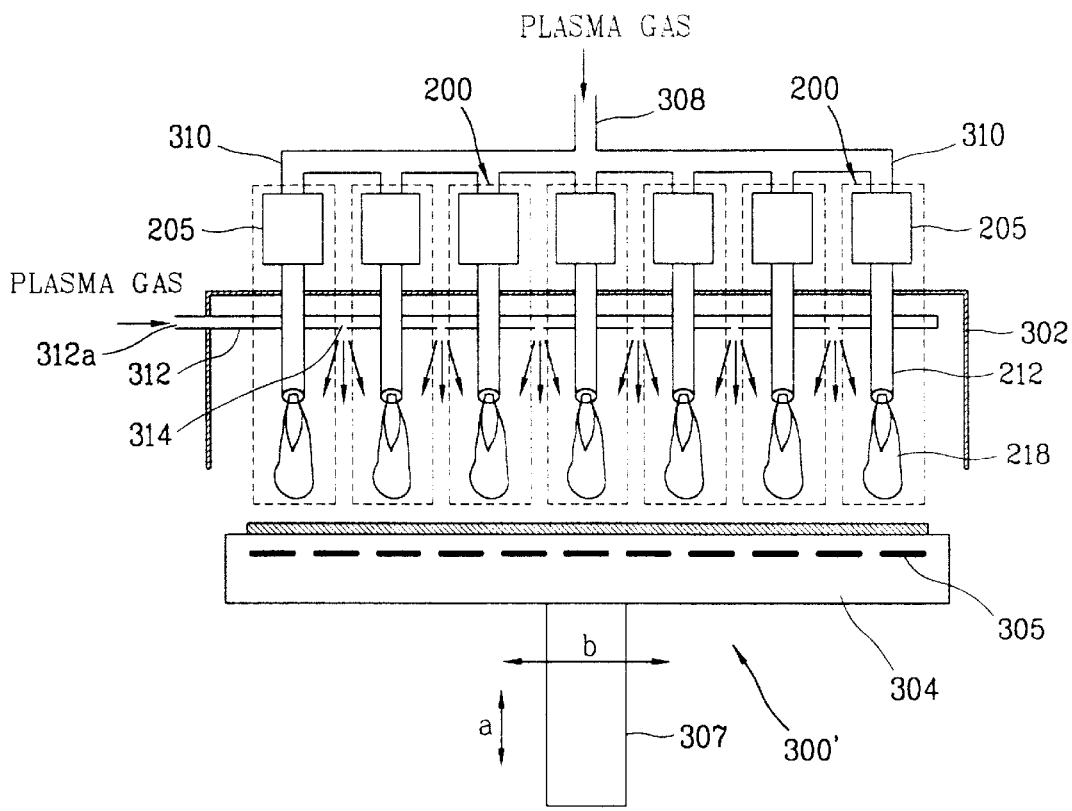
FIG. 4 is a sectional view of a plasma spray apparatus in accordance with the other embodiment of the present invention.

FIG. 4 is a sectional view of a plasma spray apparatus (300') in accordance with the other embodiment of the present invention.

The same elements are given the same reference numerals as in FIGS. 2 and 3, descriptions of which are omitted.

The plasma spray apparatus 300' of FIG. 4 has the same structure except for a disk type supply plate 312 for supplying a reactive gas.

As shown in FIG. 4, the disk type supply plate 312 is installed in the chamber 302. One end 312a of the supply plate 312 is penetratingly extended outside the chamber wall 302, through which a reactive gas is injected. The reactive gas injected into the supply plate 312 is sprayed into the chamber 302 through a plurality of nozzles 314 formed at the lower portion of the supply plate 312.

The plasma spray apparatus 300' of FIG. 4 is for a RTCVD (rapid thermal chemical vapor deposition), of which the supply plate 312 serves to inject the reactive gas for the chemical vapor deposition process.

Thus, unless the reactive gas is supplied to the disk type supply plate 312, the plasma spray apparatus 300' can be used for RTA (rapid thermal annealing) process of FIG. 3.

When the RTCVD is performed by using the plasma spray apparatus 300' of FIG. 4, the reactive gas 'c' is sprayed through the plurality of nozzle 314 formed at the reactive gas supply plate 312.

A various reactive gases can be supplied depending on a material film to be deposited. For example, if an $SiO_2$ film is to be deposited, the mixture gas of Ar and $O_2$ is supplied to the main convey tube 308 and $SiH_4$ or $Si_2H_6$ is supplied to the reactive gas supply plate 312, respectively.

Or, conversely, a reactive gas of chemical vapor deposition may be injected through the main convey tube 308 and an inert gas may be injected through the supply plate 312. That is, the inert gas and the reactive gas may be supplied to either of the main convey tube 308 and the reactive gas supply plate 312.

Various materials for a thin film can be deposited at the upper surface of the semiconductor substrate 306 depending on the kinds of the gases supplied to process of fabricating a semiconductor device, $Si_3N_4$ film, a TEOS (Tetraethyl Orthosilicate) film, a SiON (Silicon oxynitride) film, a $Ta_2O_5$ film may be deposited.

When the RTCVD is performed by using the plasma spray apparatus 300' of FIG. 4, the base pressure inside the chamber is controlled to be $10^{-7}$ Torr by a vacuum pump (not shown) like in the case of FIG. 3.

Figure 5:
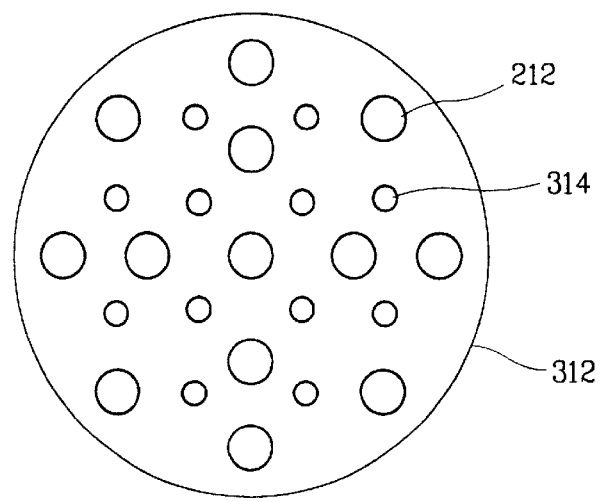
FIG. 5 is a bottom view of a supply plate of the plasma spray apparatus of FIG. 4 in accordance with the other embodiment of the present invention.

FIG. 5 is a bottom view of a supply plate of the plasma spray apparatus of FIG. 4 in accordance with the other embodiment of the present invention, or the plan view of the side facing the semiconductor substrate 306 of the reactive gas supply plate 312.

With reference to FIG. 5, a plurality of spray holes 314 are formed at the reactive gas supply plate 312, and the outer electrodes 212 of the plurality of plasma torches penetrate the supply plate 312.

As so far described, the plasma spray apparatus and the method for fabricating a semiconductor device using the plasma spray apparatus of the present invention has the following advantages.

For example, first, since the RTA or the RTCVD, the processes of fabricating a semiconductor device, are performed by using the plasma spray apparatus guaranteeing a high stability and having various process variables, various fabrication processes of the semiconductor can be implemented.

Secondly, since the substrate is heated rapidly, the process such as a shallow junction formation, which is hardly implemented even by using the RTP apparatus by a halogen lamp heating, can be easily performed.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. An apparatus for fabricating a semiconductor device comprising:
    a plasma torch having a hollow convey tube of which one end portion is made of a conductor so as to function as an inner electrode, for injecting plasma generating gas through one end portion, conveying and spraying a plasma frame through the other end portion;
    an energy applying unit for applying a microwave to the gas conveyed through the convey tube and adds an energy thereto;
    an outer electrode for surrounding the other end portion of the convey tube and its extended portion coaxially;
    an insulation tube positioned between the convey tube and the outer electrode for electrically insulating the other end portion of the convey tube and the outer electrode and surrounding a part of the convey tube coaxially;
    a power source for applying a voltage to the inner electrode and the outer electrode;
    a suscepter installed facing the plasma frame sprayed from the plasma torch;
    a suscepter moving unit for moving the suscepter in the vertical and horizontal directions to the other end portion of the convey tube; and
    a reactive chamber for surrounding the other end portion of the convey tube and the suscepter and defining a reactive space.

2. The apparatus of claim 1, wherein there are provided a plurality of plasma torches.

3. The apparatus of claim 2, wherein the insulator tube is a quartz tube.

4. The apparatus of claim 2, wherein the energy applying unit comprising:
    a waveguide resonator surrounding partially the convey tube in a closed type, and
    a magnetron for applying microwave into the waveguide resonator to excite the plasma generating gas conveyed through the convey tube.

5. The apparatus of claim 4, further comprising a reactive gas supply unit for supplying a reactive gas into the reactive chamber.

6. The apparatus of claim 5, wherein a plurality of reactive gas supply tubes are distributedly installed to be positioned in the vicinity of the other end portion.

7. The apparatus of claim 5, wherein the suscepter includes a heating unit.

8. The apparatus of claim 4, wherein the first end portions of each gas convey tube of the plurality of plasma torches are connected with a single common main convey tube.

9. The apparatus of claim 8, wherein the plasma forming gas is introduced into the main convey tube, and the energy applying unit is installed at the main convey tube, rather than being installed at each convey tube.

* * * * *